US007807222B2

(12) United States Patent
Kuznetsov

(10) Patent No.: US 7,807,222 B2
(45) Date of Patent: Oct. 5, 2010

(54) SEMICONDUCTOR PROCESSING PARTS HAVING APERTURES WITH DEPOSITED COATINGS AND METHODS FOR FORMING THE SAME

(75) Inventor: Vladimir Kuznetsov, TA Utrecht (NL)

(73) Assignee: ASM International N.V. (NL)

( * ) Notice: Subject to any disclaimer, the term of this patent is extended or adjusted under 35 U.S.C. 154(b) by 378 days.

(21) Appl. No.: 11/856,418

(22) Filed: Sep. 17, 2007

(65) Prior Publication Data

US 2009/0071407 A1    Mar. 19, 2009

(51) Int. Cl.
*C23C 16/32* (2006.01)
*C23C 16/42* (2006.01)

(52) U.S. Cl. ............... 427/249.15; 427/237; 427/248.1; 427/249.1; 118/715

(58) Field of Classification Search .............. 427/248.1, 427/249.1, 249.15, 237; 118/715
See application file for complete search history.

(56) References Cited

U.S. PATENT DOCUMENTS

| | | | |
|---|---|---|---|
| 1,694,059 A * | 12/1928 | Denny ................... | 368/93 |
| 3,011,006 A | 11/1961 | Nicholson | |
| 4,194,028 A * | 3/1980 | Sirtl et al. .............. | 427/249.16 |
| 4,377,347 A | 3/1983 | Hanmyo et al. | |
| 4,592,307 A | 6/1986 | Jolly | |
| 4,692,556 A | 9/1987 | Bollen et al. | |
| 4,706,720 A * | 11/1987 | Pattison et al. .............. | 141/327 |
| 4,976,996 A | 12/1990 | Monkowski et al. | |
| 4,978,567 A | 12/1990 | Miller | |
| 4,984,904 A | 1/1991 | Nakano et al. | |
| 5,006,220 A | 4/1991 | Hijikata et al. | |
| 5,027,746 A | 7/1991 | Frijlink | |
| 5,065,698 A | 11/1991 | Koike | |
| 5,098,198 A | 3/1992 | Nulman | |
| 5,104,514 A | 4/1992 | Quartarone | |
| 5,246,500 A | 9/1993 | Samata et al. | |
| 5,271,967 A | 12/1993 | Kramer et al. | |
| 5,315,092 A | 5/1994 | Takahashi et al. | |
| 5,336,327 A | 8/1994 | Lee | |
| 5,360,269 A | 11/1994 | Ogawa et al. | |

(Continued)

FOREIGN PATENT DOCUMENTS

DE    0 154 695    4/1982

(Continued)

OTHER PUBLICATIONS

Benson, Mass Flow Rate, NASA, (Aug. 7, 2000).*

(Continued)

*Primary Examiner*—Barbara L Gilliam
*Assistant Examiner*—Lisha Jiang
(74) *Attorney, Agent, or Firm*—Knobbe, Martens, Olson & Bear, LLP

(57) ABSTRACT

Holes in semiconductor processing reactor parts are sized to facilitate deposition of protective coatings, such as by chemical vapor deposition at atmospheric pressure. In some embodiments, the holes each have a flow constriction that narrows the holes in one part and that also divides the holes into one or more other portions. In some embodiments, the aspect ratios of the one or more other portions are about 15:1 or less, or about 7:1 or less, and have a cylindrical or conical cross-sectional shape. The holes are coated with a protective coating, such as a silicon carbide coating, by chemical vapor deposition, including chemical vapor deposition at atmospheric pressure.

12 Claims, 7 Drawing Sheets

U.S. PATENT DOCUMENTS

| | | |
|---|---|---|
| 5,421,893 A | 6/1995 | Perlov |
| 5,456,761 A | 10/1995 | Auger et al. |
| 5,474,618 A | 12/1995 | Allaire |
| 5,493,987 A | 2/1996 | McDiarmid et al. |
| 5,514,439 A | 5/1996 | Sibley |
| 5,562,774 A | 10/1996 | Breidenbach et al. |
| 5,571,333 A | 11/1996 | Kanaya |
| 5,788,799 A | 8/1998 | Steger et al. |
| 5,902,407 A | 5/1999 | deBoer et al. |
| 5,904,778 A | 5/1999 | Lu et al. |
| 5,910,221 A | 6/1999 | Wu |
| 6,024,799 A | 2/2000 | Chen et al. |
| 6,056,823 A | 5/2000 | Sajoto et al. |
| 6,066,209 A | 5/2000 | Sajoto et al. |
| 6,120,640 A | 9/2000 | Shih et al. |
| 6,129,808 A | 10/2000 | Wicker et al. |
| 6,162,543 A | 12/2000 | Dubots et al. |
| 6,170,429 B1 | 1/2001 | Schoeppe et al. |
| 6,227,140 B1 | 5/2001 | Kennedy et al. |
| 6,325,858 B1 | 12/2001 | Wengert et al. |
| 6,342,691 B1 | 1/2002 | Johnsgard et al. |
| 6,408,786 B1 | 6/2002 | Kennedy et al. |
| 6,454,860 B2 | 9/2002 | Metzner et al. |
| 6,506,254 B1 | 1/2003 | Bosch et al. |
| 6,524,428 B2 | 2/2003 | Tamura et al. |
| 6,592,707 B2 | 7/2003 | Shih et al. |
| 6,635,115 B1 | 10/2003 | Fairbairn et al. |
| 6,890,861 B1 | 5/2005 | Bosch |
| 6,942,753 B2 | 9/2005 | Choi et al. |
| 2003/0029563 A1 | 2/2003 | Kaushai et al. |
| 2003/0035905 A1 | 2/2003 | Lieberman et al. |
| 2003/0198749 A1 | 10/2003 | Kumar et al. |
| 2004/0060658 A1 | 4/2004 | Nishimoto et al. |
| 2005/0017310 A1* | 1/2005 | Granneman et al. ......... 257/382 |
| 2005/0178748 A1 | 8/2005 | Buchberger et al. |

FOREIGN PATENT DOCUMENTS

| | | |
|---|---|---|
| EP | 0 229 488 | 12/1988 |
| EP | 0 723 141 A1 | 12/1995 |
| JP | 5-64627 | 5/1993 |
| JP | 2005 294559 | 10/2005 |
| WO | WO 95/31582 | 11/1995 |
| WO | WO 97/06288 | 2/1997 |
| WO | WO 99/23276 | 5/1999 |
| WO | WO 01/11223 | 11/2002 |

OTHER PUBLICATIONS

Jensen, The Hirsch and Büchner Filtration Funnels, Journal of Chemistry Education, (Sep. 1, 2006).*

Schwartz et al., Handbook of Semiconductor Interconnection Technology, CRC Press, (Feb. 22, 2006).*

Linke, J. and Vietzke, E., "Behavior of Boron Doped Graphites, Plasma Sprayed Boron Carbides and a-C/B:H as Plasma Facing Material," *J. Fusion Tech.*, vol. 20, pp. 228-231 (Sep. 1991).

Ponnekanti et al., "Failure mechanisms of anodized aluminum parts used in chemical vapor deposition chambers," *J. Vac. Sci. Technol.*, A14(3) (May 1, 1996).

Shackelford, J. "Introduction to Materials Science for Engineers," 3d ed., Macmillan Publishing Co., pp. 398 (1992).

European Patent Office Search Report of Jan. 29, 2009; Application No. 008014738.2-2222; 5 pages.

* cited by examiner

SEMICONDUCTOR PROCESSING PARTS HAVING APERTURES WITH DEPOSITED COATINGS AND METHODS FOR FORMING THE SAME

BACKGROUND OF THE INVENTION

1. Field of the Invention

This invention relates to semiconductor processing equipment and, more particularly, to semiconductor processing equipment parts having openings coated with protective material.

2. Description of the Related Art

Semiconductor processing reactors typically include one or more process chambers that accommodate substrates for processing. Inside a process chamber, a substrate may be subjected to various processes. For example, the substrate may be subjected to vapor deposition processes or nitridation or oxidation processes that involve subjecting the substrate to highly reactive chemical species.

The chemical species, temperatures and pressures inside the process chamber can present a harsh environment for the reactor parts forming interior surfaces of the process chamber. In the course of processing a substrate, those parts may become damaged. This damage to the reactor parts may adversely affect process results or may necessitate an expensive replacement of the process chamber walls or other reactor parts.

Accordingly, there is a need for methods and apparatus for protecting semiconductor reactor parts from damage during substrate processing.

SUMMARY OF SOME EMBODIMENTS

In accordance with some embodiments of the invention, a method is provided for manufacturing a gas divider for a semiconductor processing reactor. The method comprises providing a partially-formed gas divider configured to form a wall at least partially defining a process chamber of the reactor. Holes are formed in the gas divider. The holes extend completely through the gas divider and each hole has an opening on a first side of the gas divider. The opening has a first width. Each of the holes comprises a constriction having a passage having a constriction length and a constriction width transverse to the constriction length. The constriction width is in a plane substantially parallel to a plane of the first width. The constriction width is smaller than the first width. A constriction ratio of the constriction length to the constriction width is about 15:1 or less. The hole also each comprise a first portion which opens directly to the first side of the gas divider. The first portion has a first length and a first width. The first length extends between the constriction and the opening. A first ratio of the first length to the first width is about 15:1 or less. The method also comprises coating surfaces of the gas divider, including the surface of the holes, by chemical vapor deposition.

In accordance with other embodiments of the invention, a method is provided for fabricating a semiconductor processing reactor part. The method comprises providing a partially-fabricated reactor part having a hole extending through the reactor part. The hole has a first opening on a first surface of the part. The hole also has a restriction having a passage defined by an inwardly extending protrusion on walls of the hole. The passage has a restriction aspect ratio. The hole has a first hole portion defined between the first opening and the restriction. The first hole portion has a first aspect ratio. The method also comprises determining a relationship between the first aspect ratio and a step coverage of deposited material in the first hole portion. $S_{first\,portion}$ is the step coverage and is equal to a ratio of $t_{first\,out}$:$t_{first\,portion}$, wherein $t_{first\,out}$ is a surface thickness of material deposited on the first surface and $t_{first\,portion}$ is a bottom thickness of material deposited on a bottom of the first hole portion adjacent the restriction. A target value $t_{first\,portion\,target}$ is selected. In some embodiments, the target value $t_{first\,portion\,target}$ is selected to provide in a coating thickness in the bottom of the first hole portion adjacent the restriction that is thick enough for adequate protection. A value is selected for $t_{out}$ such that $t_{out} \geq (S_{first\,portion})(t_{first\,portion\,target})$. Material is deposed on the first surface and on the walls of the hole, wherein a thickness of the deposited material on the first surface is the value selected for $t_{out}$ or more.

In accordance with other embodiments of the invention, a semiconductor processing reactor part for defining a reaction chamber for processing a semiconductor substrate is provided. The reactor part comprises a front surface configured to delimit at least part of the reaction chamber. A back surface is on a side of the reactor part opposite the front surface. A plurality of holes is disposed in the reactor part. The holes extend from the front surface to the back surface. The holes each have an opening on the back surface. The opening has a first width. The holes comprise a constriction having a passage having a constriction length and a constriction width transverse to the constriction length. The constriction width is in a plane substantially parallel to a plane of the first width. The constriction width is smaller than the first width. A constriction ratio of the constriction length to the constriction width is about 15:1 or less. The holes further comprise a first portion which opens directly to the back surface. The first portion has a first length and a first width. The first length extends between the constriction and the opening. A first ratio of the first length to the first width is about 15:1 or less. A protective coating is provided on walls of the holes and on the front and back surfaces.

DETAILED DESCRIPTION OF SOME EMBODIMENTS

Figure 1:
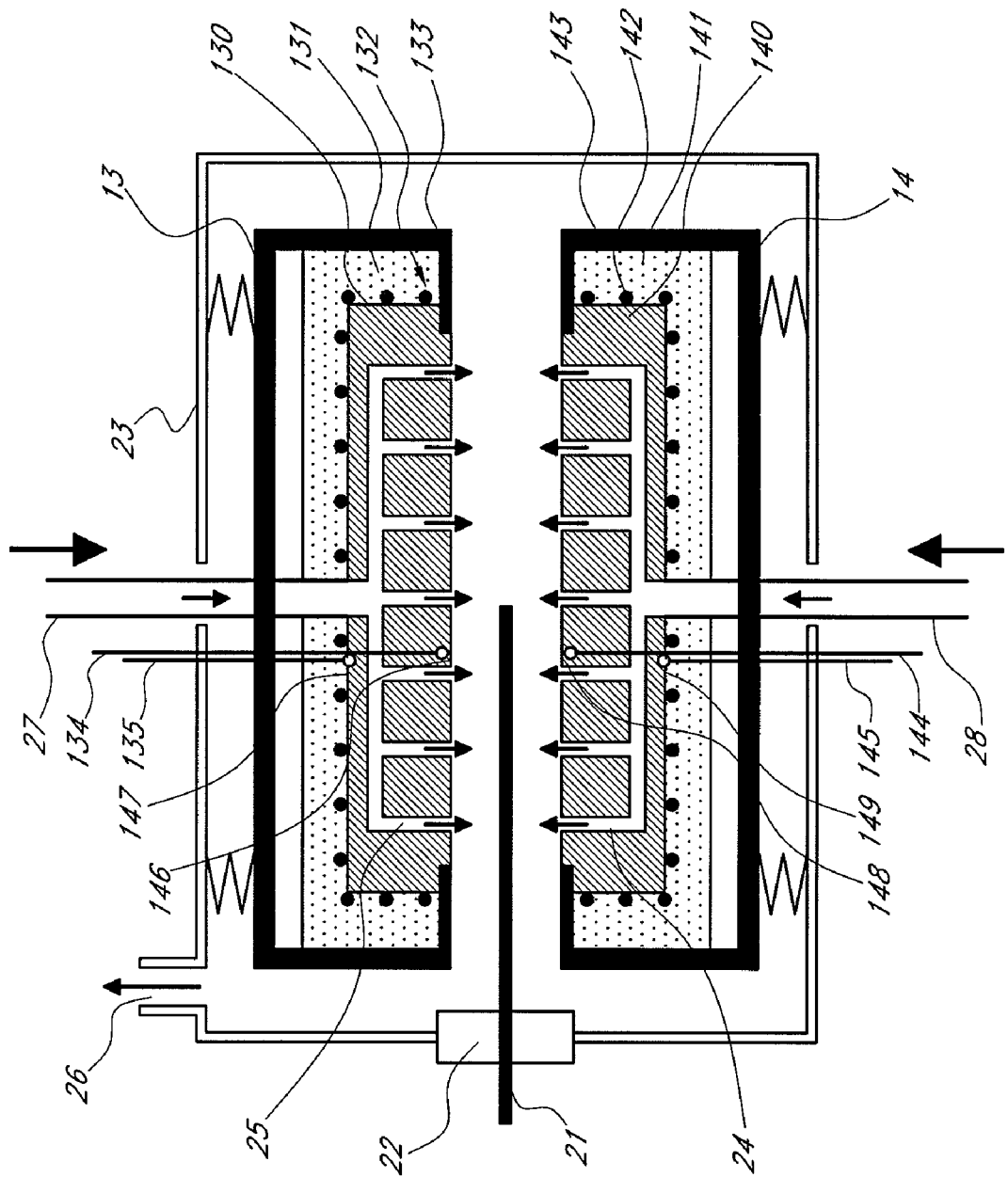
FIG. 1 is a schematic, cross-sectional side view of a semiconductor processing reactor, in accordance with embodiments of the invention.

Reactor parts may be formed of materials that can be damaged by exposure to process gases. For example, the parts may be formed of graphite. These graphite parts may be damaged by exposure to oxygen. The oxygen reacts with the graphite in a combustion reaction that causes the graphite to "burn."

As a result, the surfaces of the reactor parts, including the walls of the holes, may be coated with a protective material to protect the reactor part from exposure to reactive chemical species during semiconductor processing. The protective coating is more resistant to the harsh process environment of a process chamber than the material of the parts themselves. Silicon carbide is a commonly used protective material for protective coatings.

For example, reactor parts such as susceptors for supporting substrates or reactor blocks or gas dividers for defining the interior surfaces of a process chamber may be formed of graphite and may include openings such as gas inlets. A protective coating can be applied to surfaces of the reactor part. Abrasion and removal of the protective coating can occur during assembly and servicing of the reactors, since parts in the reactor may be repeatedly removed and reassembled during the life of the reactor. In addition, poor step coverage of the deposited coating, particularly in holes in the reactor, may leave some parts of the reactor exposed. As a result, process gases may contact and undesirably react with the material, e.g., graphite, under the coating, causing the reactor part to burn.

Various coating processes may be used to deposit the coating. However, the coating processes have been found to present various difficulties.

Chemical vapor deposition (CVD) of the protective material at atmospheric pressure is an economical coating process. The atmospheric CVD coating process does not require an expensive pump system and has a high deposition rate. However, it has been found that the conformality of atmospheric CVD processes can be low. As a result, it is difficult to deposit the coating inside deep features with high aspect ratios.

Low pressure CVD is a possible alternative for depositing coatings into deep holes. A thin coating is typically applied, since low pressure CVD is a slow and expensive process. This thin coating may not have sufficient mechanical strength to adequately protect a reactor part. For example, the coating can be easily damaged, e.g., by mechanical abrasion, especially on surfaces of the reactor part which come into contact with other reactor parts. Due to this damage, the reactor part may undesirably be exposed to process gases. For example, graphite parts can be damaged by exposure to oxygen.

A two-step coating may be used to increase the mechanical integrity of a coating formed by low pressure CVD. For example, atmospheric CVD may first be used to deposit a relatively thick layer of protective material. It will be appreciated that the coverage inside holes can be poor. To provide better coverage in the holes, low pressure CVD is used in the second deposition step. It has been found that the two step deposition can undesirably have poor adhesion between the two deposited layers. For example, the layer deposited by low pressure CVD may be prone to peeling off of the layer deposited by low pressure CVD. Another difficulty with a two-step coating is the increased complexity of the fabrication process and the resulting higher costs of the parts formed using the two-step coating process Advantageously, it has been found that good step coverage can be achieved in a one step deposition by setting the sizes of the holes at particular values. In some embodiments, the holes extend completely through a reactor part, such as a gas divider, including a susceptor for supporting substrates. Each hole has a constriction or restriction that narrows it. A passage in the constriction allows gas flow through it. The constriction divides the hole into one or more portions. For example, the constriction can be located near a central part of the hole, thereby dividing the holes into two portions, one portion on either side of the constriction. In some other embodiments, the constriction is disposed at one end of the hole, and the remainder for the hole forms a single portion. In some embodiments, the aspect ratios of the various portions of the hole and the passage through the constriction are about 15:1 or less. In some other embodiments, the aspect ratios are about 7:1 or less. In some embodiments, the various portions have a cylindrical or conical cross-sectional shape. Advantageously, holes according to embodiments of the invention allow deposition of coatings with good step coverage. The deposition deposits protective material, such silicon carbide, with adequate step coverage for a single step deposition to be used for the protective coating. Advantageously, atmospheric CVD (chemical vapor deposition performed at about atmospheric pressure) can be used to deposit the coating at a good deposition rate and relatively low cost. In addition, difficulties with the adhesion and peeling of multiple deposited layers are avoided.

In some embodiments, the constriction is placed in a central region along the length of a hole. The aspect ratios of first and second portions of the hole on either side of the constriction are chosen to be about equal. A relationship between the aspect ratios of the first and second portions and step coverage of materials deposited in the holes is determined. Based upon this relationship, the thickness ($t_{out}$) of the film to be deposited on the surfaces of the reactor part outside of the holes can be determined. This thickness $t_{out}$ is typically more easily measured than the thickness of the deposited coating inside the holes. $t_{out}$ is chosen such that it is greater than the desired thickness (t) of the deposited coating inside the holes times the step coverage (S); that is, in some embodiments, $t_{out} \geq S \cdot t$. This relationship is preferably fulfilled for both the first portion and the second portion, with S being the step coverage in each portion, t being the thickness of the deposited coating at the bottom of each portion and $t_{out}$ being the thickness of the layer deposited outside of the hole and immediately adjacent the corresponding one of the first and the second portions. The passage in the constriction is preferably also chosen to have a similar aspect ratio to that of the first and second portions of the hole.

Reference will now be made to the Figures, wherein like numerals refer to like parts throughout. The Figures are not necessarily drawn to scale.

It will be appreciated that the preferred embodiments may be applied to various reactors known to those of skill in the art, but has particular advantages when used in a floating substrate reactor. For example, the reactor design illustrated in FIG. 1 does not require that a substrate 21 be mechanically supported during processing; that is, the substrate 21 can be processed without being directly contacted by a solid support. This enables very uniform and rapid heating of the substrate 21 without the cold spots that may occur in reactors where substrates are mechanically contacted during a semiconductor fabrication process. In addition, the upper and lower blocks 13 and 14 of the reactor 1 surrounding the substrate are preferably relatively massive such that each has a high heat capacity relative to the substrate 21, helping to stabilize the temperature of the substrate and minimizing the susceptibility of the reactor 1 to temperature fluctuations upon loading and unloading of the substrate 21 into the reactor 1. A reactor having the basic configuration of the reactor 1 is available commercially under the trade name Levitor® from ASM International, N.V. of The Netherlands.

With continued reference to FIG. 1, the heat treating apparatus of the reactor 1 includes an upper block 13 and a lower block 14 that are in a housing 23. It will be appreciated that the surfaces of the blocks 13 and 14 facing each other delimit a chamber for processing or treating a substrate 21. As shown in FIG. 1, the housing 23 is provided with a flap 22 that can be opened for loading and subsequently removing a substrate 21. The lower block 14 and the upper block 13 can be moved towards one another by lifting rods 27 and 28. Alternatively, only one of the blocks is moveable.

The upper block 13 is made up of an upper furnace body 130, an insulating jacket 131, a heating coil or furnace body heater 132 arranged on the inside of the insulating jacket 131, and an outer jacket 133. Similarly, the lower block 14 is made up of a lower furnace body 140, an insulating jacket 141, a heating coil 142 arranged on the inside of the insulating jacket 141, and an outer jacket 143. In some embodiments, each furnace body 130, 140 has a mass greater than 10 times or greater than 40 times the mass of a substrate for which the reactor 1 is designed to accommodate.

The upper furnace body 130 is preferably provided with at least one temperature sensor 134 and the lower furnace body 140 is preferably also provided with at least one temperature sensor 144. The temperature sensors 134, 144 are arranged to measure temperatures close to the surfaces 146 and 148 of the furnace bodies 130, 140, respectively, that are adjacent to the substrate 21. The temperature sensors 134, 144 are placed sufficiently close to the furnace body surfaces 146 and 148 to gauge the process temperatures experienced by the substrate 21 during a heat treatment and to detect a reduction in temperature of the furnace bodies 130, 140 caused by positioning of the substrate 21 in its vicinity for heat treatment.

The upper furnace body 130 may also be provided with at least one other temperature sensor 135 that is arranged close to the heater side 147 of the upper furnace body 130. In a similar manner, the lower furnace body 140 may be provided with a temperature sensor 145 arranged close to the side 149 of the lower furnace body 140. The temperature sensors 135, 145 may be used to gauge the temperature gradient across the thickness of the furnace bodies 130, 140, respectively.

Process gases (including inert gases) are supplied both from the upper furnace body 130 through openings 25 and the lower furnace body 140 through openings 24. The gases can be discharged through a discharge opening 26 formed in the reactor housing 23.

The upper block 13 and the lower block 14 are preferably moved apart before introducing the substrate 21 into the reactor 1, as shown in FIG. 1. After the substrate 21 has been introduced into the reactor 1, the blocks 13 and 14 are moved towards one another by the lifting rods 27 and 28 in such a way that the distance between the substrate 21 and the adjacent surfaces 146 and 148 of the furnace bodies 130 and 140, respectively, is reduced. Preferably, when positioned at a heat treatment position, the substrate 21 is less than about 2 mm and more preferably less than about 1 mm from the surfaces 146 and 148. In the illustrated embodiment, as shown in FIG. 1, the substrate is held in a stable position by gas streams issuing from the openings 24 and 25, without requiring further mechanical support. It will be appreciated, however, that in other arrangements, support structures such as support pins may be used to support and space the substrate from the bodies 130 and 140. Moreover, while illustrated as being symmetrically spaced from the bodies 130 and 140, the substrate 21 may be spaced closer to one or the other of the bodies 130 or 140 in other arrangements.

Figure 2A:
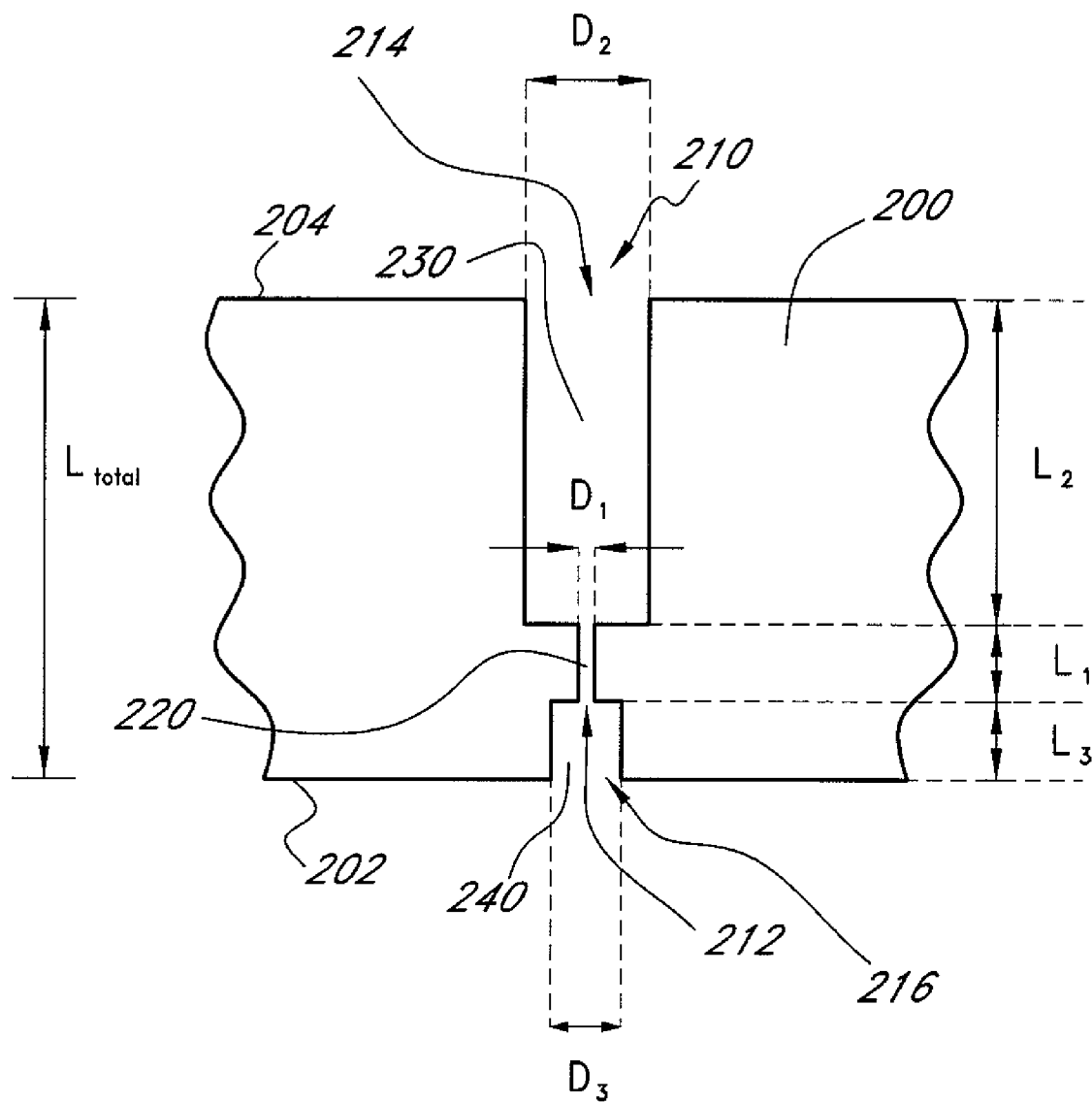
FIG. 2A is a schematic, cross-sectional side view, in isolation, of a hole in a semiconductor processing reactor part, in accordance with embodiments of the invention.

With reference to FIG. 2A, a portion of a reactor part 200 is shown. The reactor part 200 may form various structures of a reaction chamber. For example, the part 200 may be a susceptor or a furnace body, such as one of the furnace bodies 130, 140 (FIG. 1). It will be appreciated that the furnace bodies can function was gas dividers by defining and separating the volume of a reaction chamber from other gas volumes, such as an ambient atmosphere, process gas sources or a gas delivery system. The reactor part 200 may be formed of various materials compatible with semiconductor fabrication, including, without limitation, graphite. In some embodiments, the reactor part 200 can be formed metal, such as stainless steel, Inconel®, Hastelloy® and high temperature steels. The reactor part 200 has a front or first surface 202 that is configured to define a wall of a reaction chamber and that, in some embodiments, directly faces a surface of a substrate in the reaction chamber (not shown). The reactor part 200 also has a back or second surface 204 opposite the front surface 202.

A hole 210 is disposed in the reactor part 200. The hole 210 has a constriction or restriction 212. The constriction 212 may be formed by a protrusion or other material on sidewalls of the hole 210. The protrusion or other material narrows the hole 210 to form a passage 220. The hole 210 also has a first portion 230, extending between the constriction 212 and a hole opening 214, and a second portion 240, extending between the constriction 212 and a hole opening 216. In the illustrated embodiment, the hole 210 extends completely through the reactor part 200, from the hole opening 216 on the front surface 202 to the hole opening 214 on the back surface 204.

With continued reference to FIG. 2A, the thickness of the reactor part 200 and the total length of the hole 210 is $L_{total}$. The constriction passage 220 has a length $L_1$ and a width $D_1$. The first portion 230 has a length $L_2$ and a width $D_2$ at the opening 214. The second portion 240 has a length $L_3$ and a width $D_3$ at the opening 216.

In some embodiments, particularly where the reactor part 200 is a reactor block in a floating substrate reactor, $D_1$ is about 0.2-1 mm, which has advantages for providing a gas cushion for a substrate and for uniformly distributing the gas over the entire substrate. The length $L_1$ can vary over a wide range and is about 0.5-2 mm in some embodiments.

Advantageously, placing the restriction 212 in a central region along the length of the hole 210 facilitates the diffusion of gases out of the passage 220 thereby facilitating a uniform distribution of gases onto a substrate surface. In addition, placing the restriction 212 in a central region of the hole 210 reduces the distance between the restriction 212 and the respective outer surfaces 202, 204. Advantageously, such a placement of the restriction 212 allows widths $D_2$ and $D_3$ to be selected to result in relatively small aspect ratios, thereby allowing for good coverage of the interior surfaces of the hole 210 without exceeding a desired hole diameter. Preferably, the opening 216 has a width $D_3$ of about 2 mm or less, which has advantages for uniformly heating a substrate. In embodiments where the part 200 is used to heat a substrate, it has been found that a width larger than 2 mm can cause non-uniform heating and cold spots in the substrate, due to the increased distance of the substrate from the surfaces of the part 200 as widths increase.

To facilitate deposition of a protective coating in the hole 210, the aspect ratio ($L_2:D_2$) of the first portion 230 is preferably is about 15:1 or less, or about 7:1 or less. For example, in some embodiments, the aspect ratio can be about 10:1 or about 8:1. The aspect ratio ($L_3:D_3$) of the second portion 240 is preferably about 15:1 or less, or about 7:1 or less. The aspect ratio ($L_1:D_1$) of the passage 220 is preferably about 15:1 or less, or about 7:1 or less. Thus, the first portion 230, the second portion 240 and the passage 220 preferably have aspect ratios within the same range. Advantageously, it has been found that maintaining the aspect ratios of these various parts of the holes 210 in these ranges of facilitates deposition of a protective coating and uniform coverage of the walls of the hole 210 including the walls of constriction passage 220. In some embodiments, one or more of the aspect ratios can be of substantially the same value, e.g., all the aspect ratios can be of substantially the same value.

Figure 2B:
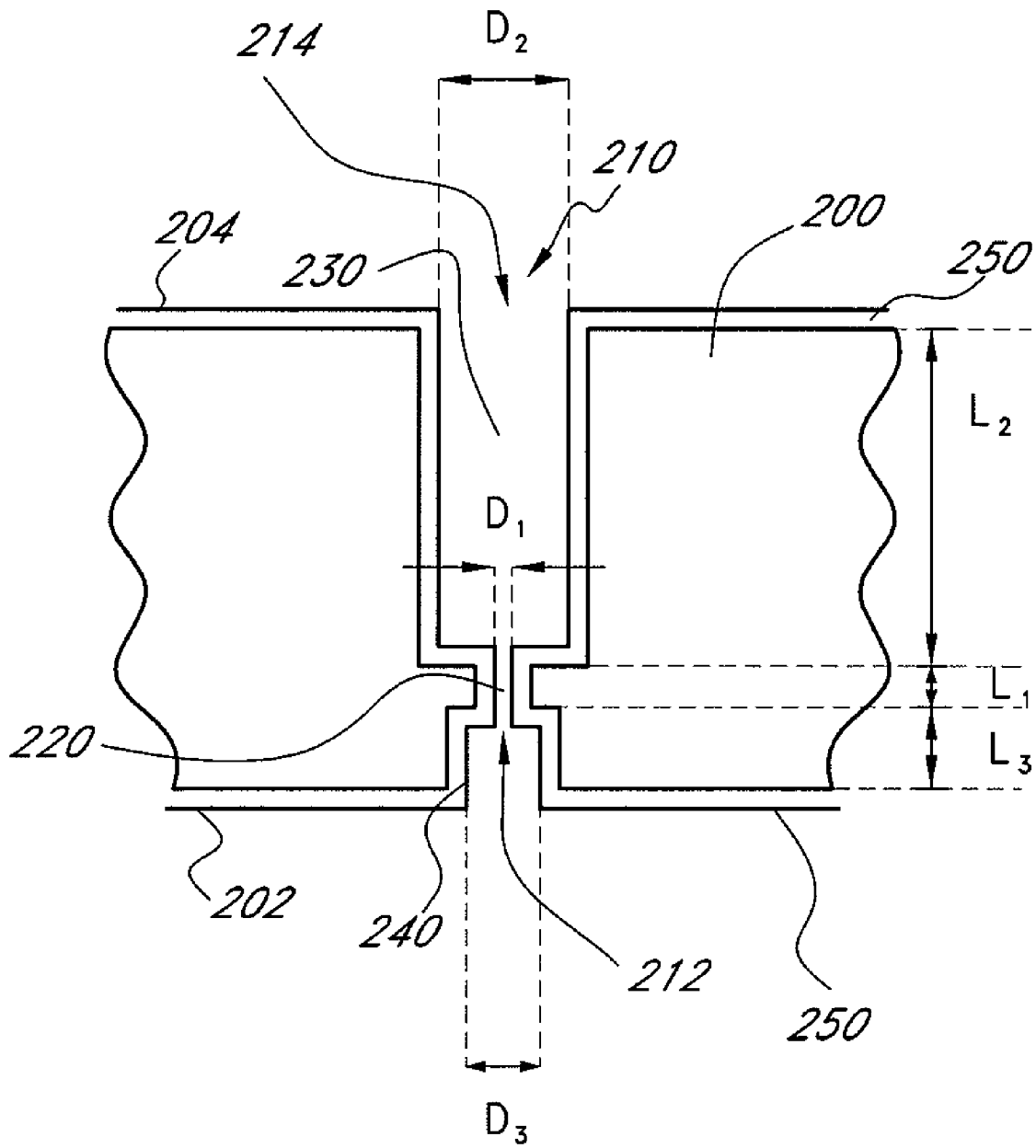
FIG. 2B is a schematic, cross-sectional side view, in isolation, of the semiconductor processing reactor part of FIG. 2A after deposition of a protective coating, in accordance with embodiments of the invention.

With reference to FIG. 2B, a protective coating 250 can be deposited on exposed surfaces of the reactor part 200. Advantageously, CVD at atmospheric pressure can be used to accomplish the deposition and can completely coat exposed surfaces of part 200 with the layer 250. In some embodiments, the layer 250 on the front surface 2002 and/or back surface 204 is deposited to a thickness of about 500 µm or more, or about 600 µm or more.

Figure 3:
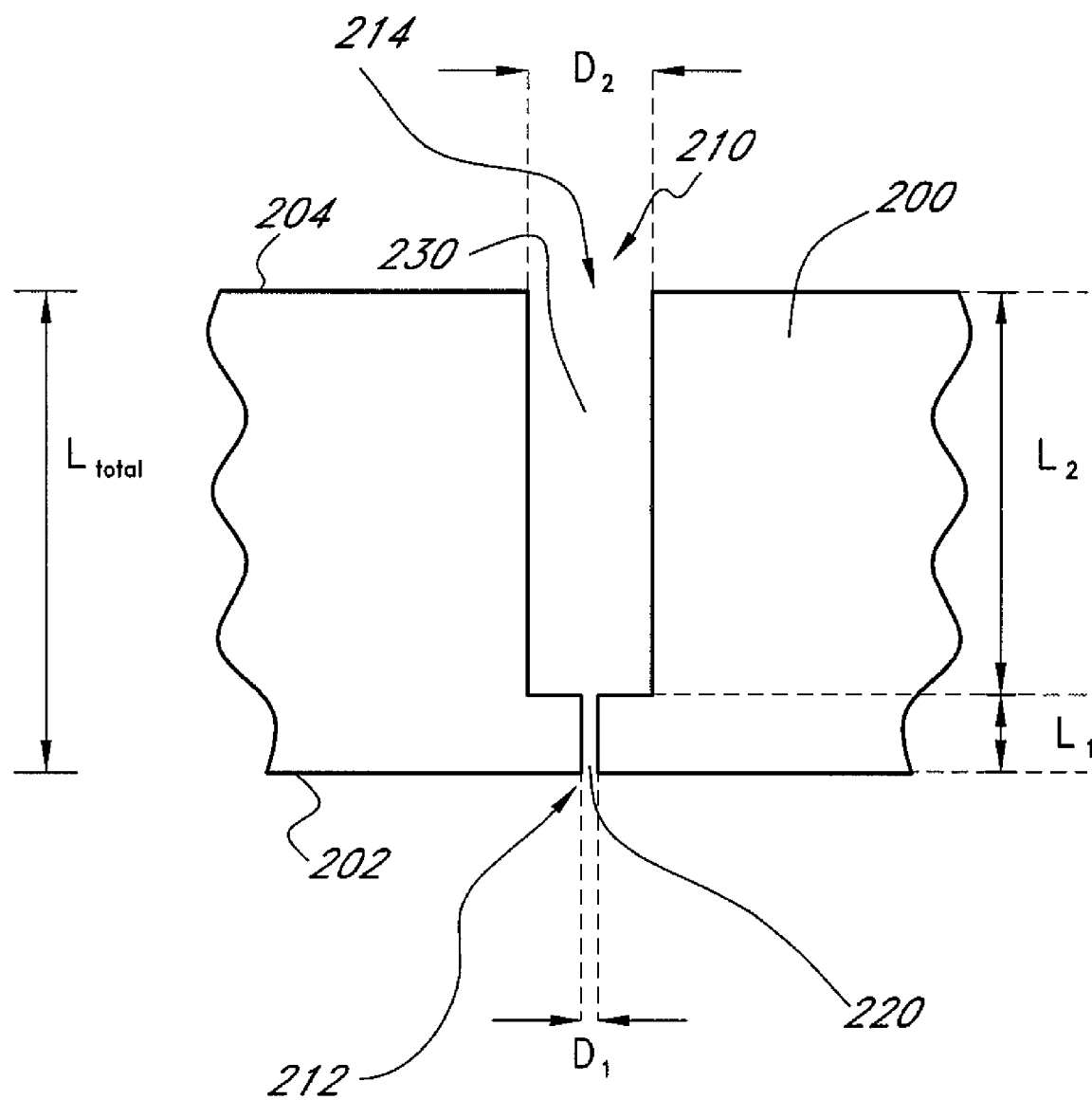
FIG. 3 is a schematic, cross-sectional side view, in isolation, of another hole in a semiconductor processing reactor part, in accordance with embodiments of the invention.
Figure 4:
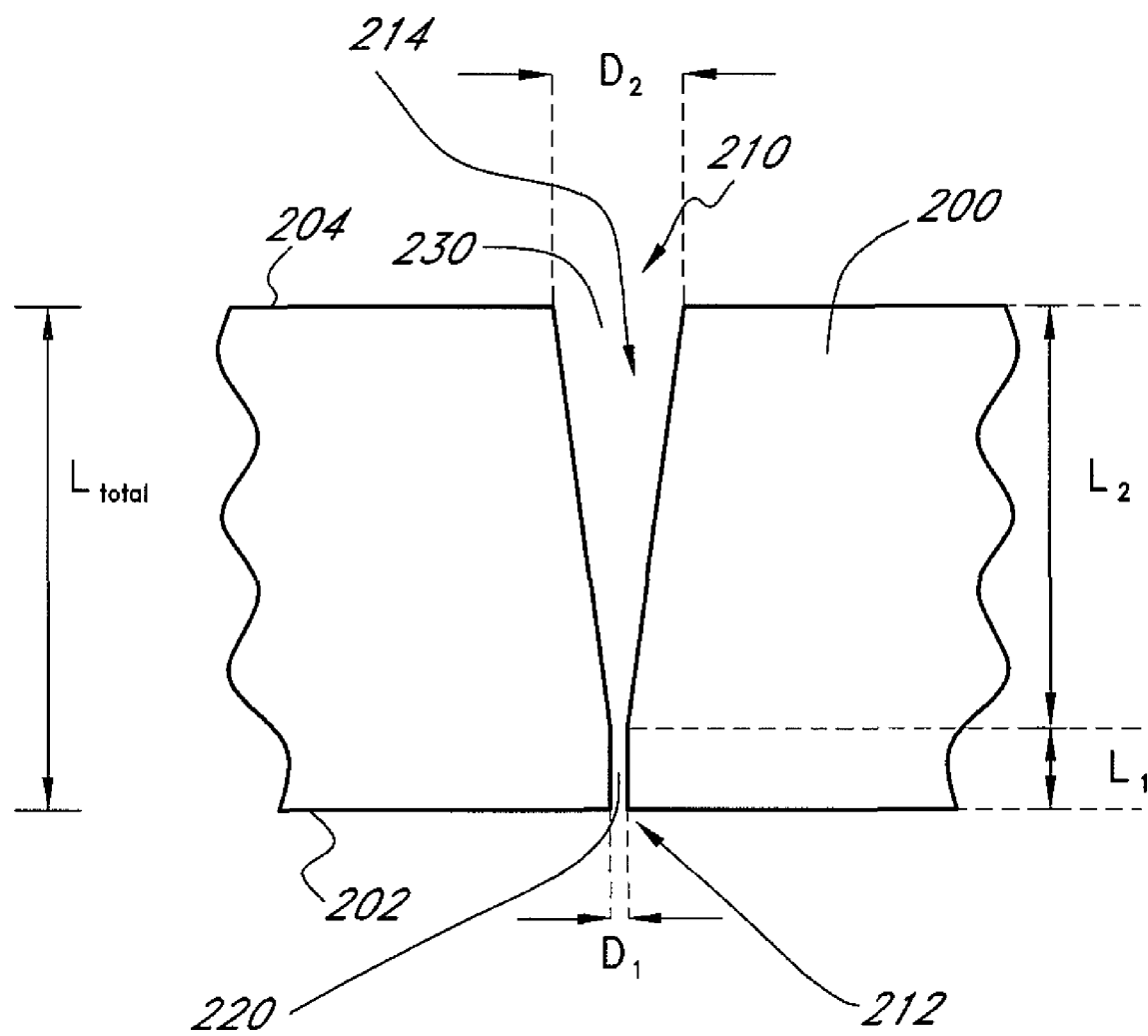
FIG. 4 is a schematic, cross-sectional side view, in isolation, of yet another hole in a semiconductor processing reactor part, in accordance with embodiments of the invention.
Figure 5:
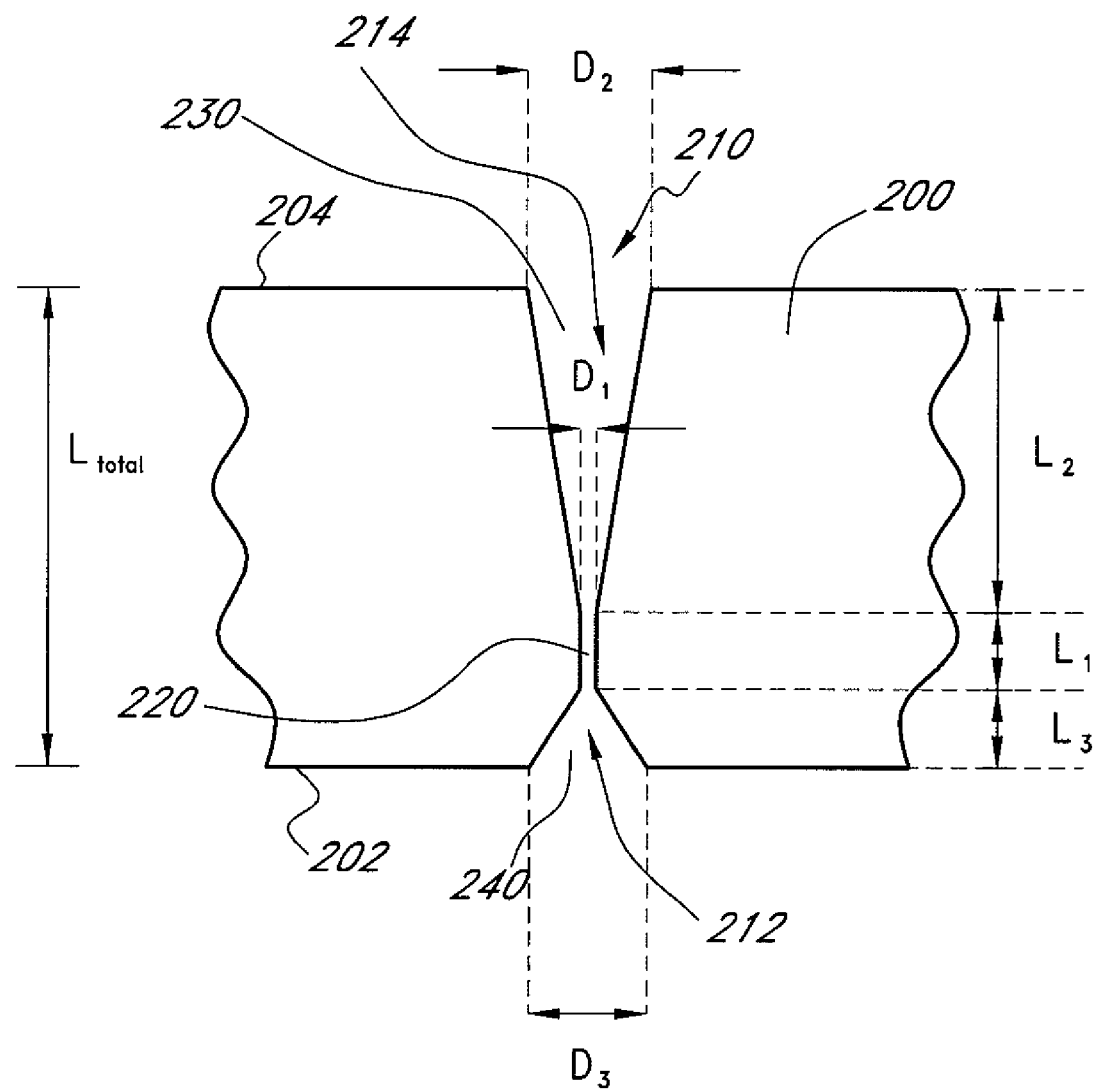
FIG. 5 is a schematic, cross-sectional side view, in isolation, of another hole in a semiconductor processing reactor part, in accordance with embodiments of the invention.

It will be appreciated that the holes 210 can take other shapes. FIGS. 3-5 provide non-limiting examples of other shapes. These other shapes have aspect ratios as described herein and can be coated as described herein, e.g., as described with reference to FIGS. 2A and 2B.

With reference to FIG. 3, the restriction 212 is placed at one end of the hole 210. As a result, the restriction 212 defines only the first portion 230 between the restriction 212 and the opening 214. It will be appreciated that the first portion 230 and the second portion 240 illustrated in FIGS. 2A, 2B and/or 3 have a generally cylindrical shape, as seen in the illustrated cross-sectional views.

With reference to FIGS. 4 and 5, the first portion 230 and/or the second portion 240 can have a generally conical shape, as seen in the illustrated cross-sectional views. With reference to FIG. 4, the first portion 230 can have a conical shape. The first portion 230 is defined by the restriction 212, which is at a narrow tip of the first portion 230. The opening 214 defines the wide end of the cone.

With reference to FIG. 5, the restriction 212 can be positioned more centrally along a length of the hole 210. As illustrated, both the first portion 230 and the second portion 240 can have conical shapes, with the restriction 212 at the tips of the first portion 230 and the second portion 240.

The first portion 230, the second portion 240 and the passage 220 can assume other shapes or combinations of shapes. For example, the first portion 230, the second portion 240 and the passage 220 can have different combinations of shapes. For example, one of the first portion 230 and second portion 240 can be cylindrical, while the other of the first portion 230 and second portion 240 can be cone shaped. In addition, the passage 220 can have a conical shape.

While embodiments of the invention can advantageously be applied to holes through which gas flows, in some embodiments, the holes can accommodate other reactor parts. For example, thermocouples can be placed inside the holes. In addition, to further protect sidewalls of the holes from damage, a protective insert can be provided between the sidewalls and any reactor part placed in the holes. Such an insert in described in U.S. patent application Ser. No. 11/779,033, filed Jul. 17, 2007, the entire disclosure of which is incorporated by reference herein.

EXAMPLE

A protective coating was deposited on exposed surfaces of a reactor block for a Levitor® floating substrate reactor available from ASM International, N.V. of The Netherlands. the reactor block was provided with holes extending completely through the block. The holes had the general shape of the hole 210 illustrated in FIG. 2A. As a result, the reference numerals and variables from that figure are used in this example for ease of description.

The deposited coating had a thickness of about 70-90 µm at the bottom of the second portion 240 near the restriction 212. The width $D_3$ was 2 mm and the length $L_3$ was about 15 mm. The coating thickness on the outer surface 202 was selected to be 600 µm. At the opposite side of the restriction 212, between the restriction and the back surface 204, the length $L_2$ was 35 mm and the width $D_2$ was 6 mm. The thickness $L_{total}$ of the graphite part was about 50 mm. The restriction diameter was 0.5 mm and the restriction length was 1 mm.

Figure 6:
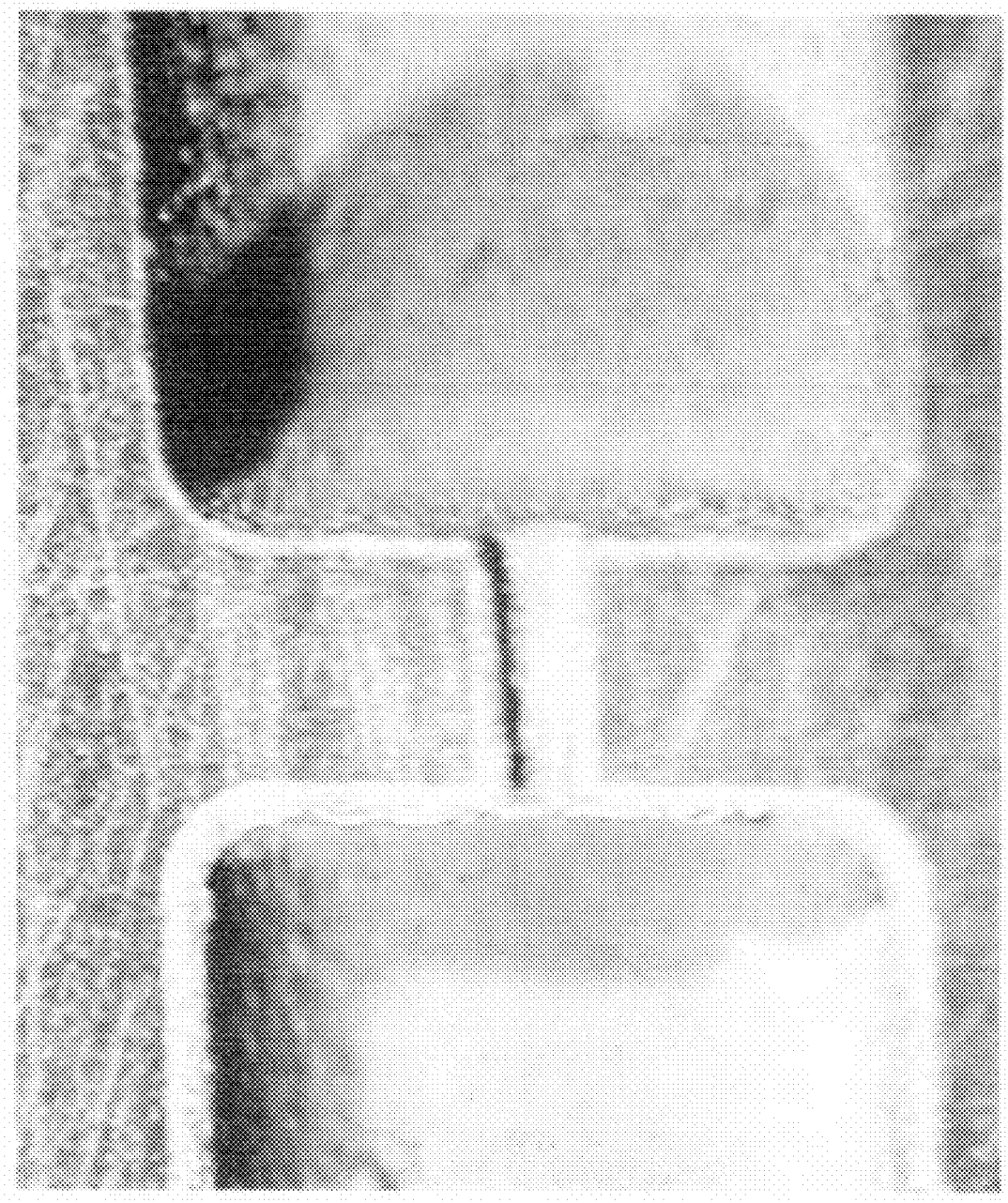
FIG. 6 is a photograph showing a cross-section of a semiconductor processing reactor part with a protective coating, in accordance with embodiments of the invention.

FIG. 6 is a photograph showing a cross-section of the reactor part used for testing the step coverage of the coating. A part of a hole in the reactor part adjacent the constriction is shown in isolation. In the reactor part of FIG. 6, $D_2$ and $D_3$ were equal and were 2 mm. Advantageously, the deposited coating is seen to completely cover the surfaces of the hole.

Accordingly, it will also be appreciated by those skilled in the art that various omissions, additions and modifications may be made to the methods and structures described above without departing from the scope of the invention. All such modifications and changes are intended to fall within the scope of the invention, as defined by the appended claims.

I claim:

1. A method for manufacturing a gas divider for a semiconductor processing reactor, comprising:
   providing a partially-formed gas divider configured to form a wall at least partially defining a process chamber of the reactor;
   forming holes in the gas divider, the holes extending completely through the gas divider and each hole having an opening on a first side of the gas divider, the opening having a first width, each of the holes comprising:
      a constriction having a passage having a constriction length and a constriction width transverse to the constriction length, the constriction width in a plane substantially parallel to a plane of the first width, wherein the constriction width is smaller than the first width, wherein a constriction ratio of the constriction length to the constriction width is about 15:1 or less; and
      a first portion which opens directly to the first side of the gas divider, the first portion having a first length and a first width, the first length extending between the constriction and the opening, wherein a first ratio of the first length to the first width is about 15:1 or less; and
   coating surfaces of the gas divider, including the surface of the holes, by chemical vapor deposition.

2. The method of claim 1, wherein coating surfaces is performed at about atmospheric pressure.

3. The method of claim 1, wherein coating surfaces comprises depositing silicon carbide.

4. The method of claim 1, wherein forming holes further comprises forming each of the holes having a second portion which opens directly to a second side of the gas divider, the second portion having a second length and a second width, the second length and the second width defining a second ratio of length to width, wherein the second ratio is about 15:1 or less.

5. The method of claim 4, wherein the constriction ratio, the first ratio and the second ratio are substantially similar.

6. The method of claim 5, wherein the constriction ratio, the first ratio and the second ratio are about 7:1 or less.

7. The method of claim 1, wherein the partially-formed gas divider is formed of graphite.

8. A method for fabricating a semiconductor processing reactor part, comprising:
   providing a partially-fabricated reactor part having a hole extending through the reactor part, the hole having a first opening on a first surface of the part, the hole having a restriction, the restriction having a passage defined by an inwardly extending protrusion on walls of the hole, the passage having a restriction aspect ratio, the hole having a first hole portion defined between the first opening and the restriction, the first hole portion having a first aspect ratio;
   determining a relationship between the first aspect ratio and a step coverage of deposited material in the first hole portion, wherein $S_{first\ portion}$ is the step coverage and is equal to a ratio of $t_{first\ out}$:$t_{first\ portion}$, wherein $t_{first\ out}$ is a surface thickness of material deposited on the first surface and $t_{first\ portion}$ is a bottom thickness of material deposited on a bottom of the first hole portion adjacent the restriction;

selecting a target value $t_{first\ portion\ target}$ for $t_{first\ portion}$;

selecting a value for $t_{out}$ such that $t_{out} \geq (S_{first\ portion})(t_{first\ portion\ target})$; and depositing the material on the first surface and on the walls of the hole, wherein a thickness of the deposited material on the first surface is the value selected for $t_{out}$ or more.

9. The method of claim 8, wherein depositing $t_{out}$ is about 500 μm or more and $t_{first\ portion}$ is about 70 μm or more.

10. The method of claim 8, wherein the hole further comprises:

a second opening on a second surface of the part; and a second hole portion defined between the second opening and the restriction, the second hole portion having a second aspect ratio, and further comprising:

determining a relationship between the second aspect ratio and a step coverage of deposited material in the second hole portion, wherein $S_{second\ portion}$ is the step coverage and is a ratio of $t_{second\ out}:t_{second\ portion}$, wherein $t_{second\ out}$ is a surface thickness of material deposited on the second surface and $t_{second\ portion}$ is a bottom thickness of material deposited on a bottom of the second hole portion adjacent the restriction;

selecting a target value $t_{second\ portion\ target}$ for $t_{second\ portion}$; and selecting a value for $t_{second\ out}$ such that $t_{second\ out} \geq (S_{second\ portion})(t_{second\ portion\ target})$.

11. The method of claim 8, wherein the reactor part is provided with a planar surface at least as wide as a major surface of a substrate accommodated in the reaction chamber.

12. The method of claim 11, wherein the reactor part forms a reactor block configured to interface with an other reactor block positioned opposite the reactor block such that the reactor block extends across the major surface of a substrate and the other reactor block extends across an opposite major surface of the substrate upon assembly of the semiconductor reactor and retention of the substrate.

* * * * *